(12) United States Patent
Lombaard

(10) Patent No.: US 8,093,954 B1
(45) Date of Patent: Jan. 10, 2012

(54) HIGH-FREQUENCY INPUT CIRCUIT

(75) Inventor: Carel J. Lombaard, Cork (IE)

(73) Assignee: Cypress Semiconductor Corporation, San Jose, CA (US)

(*) Notice: Subject to any disclaimer, the term of this patent is extended or adjusted under 35 U.S.C. 154(b) by 467 days.

(21) Appl. No.: 11/439,762

(22) Filed: May 23, 2006

Related U.S. Application Data

(60) Provisional application No. 60/683,960, filed on May 23, 2005.

(51) Int. Cl.
*H01L 29/00* (2006.01)

(52) U.S. Cl. .......... 330/305; 330/307; 257/79; 257/528; 257/159; 257/536

(58) Field of Classification Search ............ 330/65, 330/66, 302, 305, 307; 257/159, 79, 528, 257/536
See application file for complete search history.

(56) References Cited

U.S. PATENT DOCUMENTS

| | | | | |
|---|---|---|---|---|
| 4,037,168 A | * | 7/1977 | Katoh et al. | 330/306 |
| 6,127,894 A | * | 10/2000 | Alderton | 330/286 |
| 2004/0012440 A1 | * | 1/2004 | Hughes et al. | 330/85 |

* cited by examiner

*Primary Examiner* — Michael Shingleton

(57) ABSTRACT

A high-frequency input circuit. The input circuit includes an input node, a bond pad, and a signal conversion resistor coupled in series between the input node and the bond pad to convert substantially all of a signal voltage at the input node to a signal current at the bond pad.

20 Claims, 9 Drawing Sheets

HIGH-FREQUENCY INPUT CIRCUIT

RELATED APPLICATIONS

This application claims the benefit of U.S. Provisional Application No. 60/683,960, filed on May 23, 2005.

TECHNICAL FIELD

This invention relates to circuitry and, more particularly, to a high-frequency input circuit.

BACKGROUND

Signal integrity is a prominent field of research and development as electronics continue to operate at higher frequencies and processors continue to operate at higher speeds. Conventional signaling circuits on an integrated circuit limit the signal integrity at relatively high frequencies. Normally, the signal integrity decreases as the operating frequency increases because of transmission line reflections and phase changes. These signaling phenomena often result from electrical energy that is shunted by an effective input impedance of the signaling circuit. Thus, the voltage generated across the effective input impedance is a limiting factor for the operating frequency of a computer or another electronic system.

FIG. 1 illustrates a conventional signaling circuit including an input amplifier. The input amplifier is also referred to as a buffer or a receiver. The conventional signaling circuit includes a voltage receiving input buffer which receives a voltage signal via a transmission line coupled to an input pin. A shunt resistance is coupled between the input pin, or bond pad, or input pad, and ground. A termination resistor for transmission line matching is one example of a shunt resistance. Although the shunt resistance can be coupled within the conventional signaling circuit in different ways, the shunt resistance appears in parallel with the input pad capacitance.

This configuration in which the shunt resistance appears in parallel with the effective input capacitance causes a signal voltage swing to be applied across the effective input capacitance. At very high frequencies, the impedance of this capacitance reduces significantly, effectively shunting a large part of the signal current through it. A smaller portion of the signal current generates a voltage across the shunt resistance. Shunting the signal current through the effective input capacitance can cause attenuation and phase shift in the received signal, as well as reflections on the board trace (i.e., transmission line). This implies that, even if it were possible to launch a "perfect" signal at a very high frequency at the transmitter end of a transmission line, the signal is not actually received at the input amplifier if the parasitic pin capacitance of the input pad dominates at the transmission frequency and above.

Note that the reference here to a signal of high frequency should not be understood to exclude signals of lower frequency than the exemplary "high" frequency, where the term "frequency" refers more specifically to the fundamental, or "clock" frequency of, for example, a clock signal or the carrier frequency of a radio frequency (RF) signal, and the signal itself contains higher frequencies than the fundamental frequency. Significant distortion may already occur even if the clock frequency is lower than the frequency at which the capacitance begins to dominate. Such distortion may degrade the signal integrity of the received clock signal to such an extent that it may impact system performance beyond acceptable levels.

The input impedance characteristic of one example of a conventional signaling circuit is shown in FIG. 2. The input impedance characteristic degrades substantially as the frequency of the signal approaches about 3.0 GHz. Although the input impedance characteristic appears to improve above about 3.0 GHz, this is due to series package parasitic inductance (not shown in FIG. 1) which "masks" the effect of the capacitive impedance. In other words, the parasitic inductance becomes significant to the extent of obscuring the parasitic capacitance, creating the appearance of restored input impedance, but the signal integrity of the retrieved signal does not actually improve. Instead, the retrieved signal is attenuated even further.

BRIEF DESCRIPTION OF THE DRAWINGS

The present invention is illustrated by way of example, and not by way of limitation, in the figures of the accompanying drawings.

DETAILED DESCRIPTION

Figure 1:
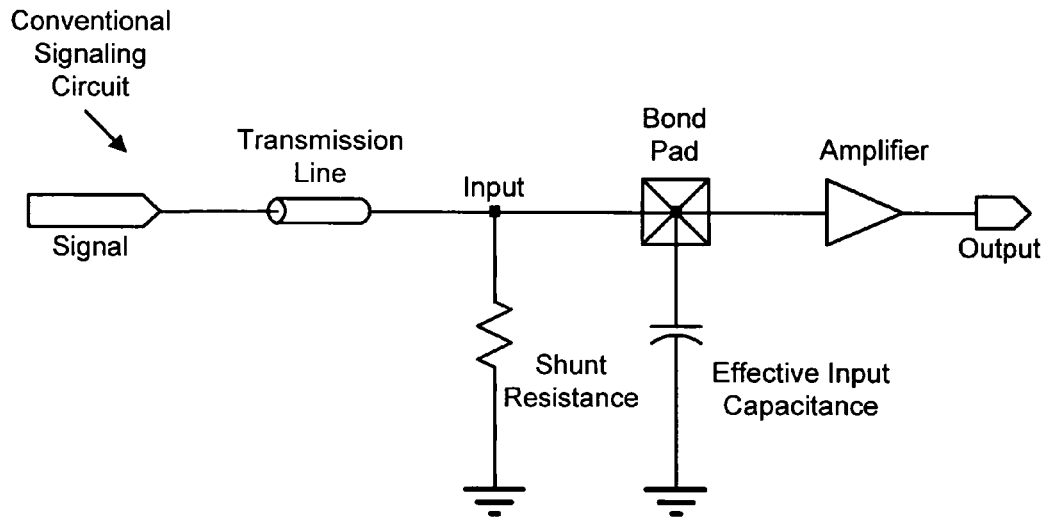
FIG. 1 illustrates a conventional signaling circuit having effective input capacitance appearing in parallel with a matching resistor.
Figure 2:
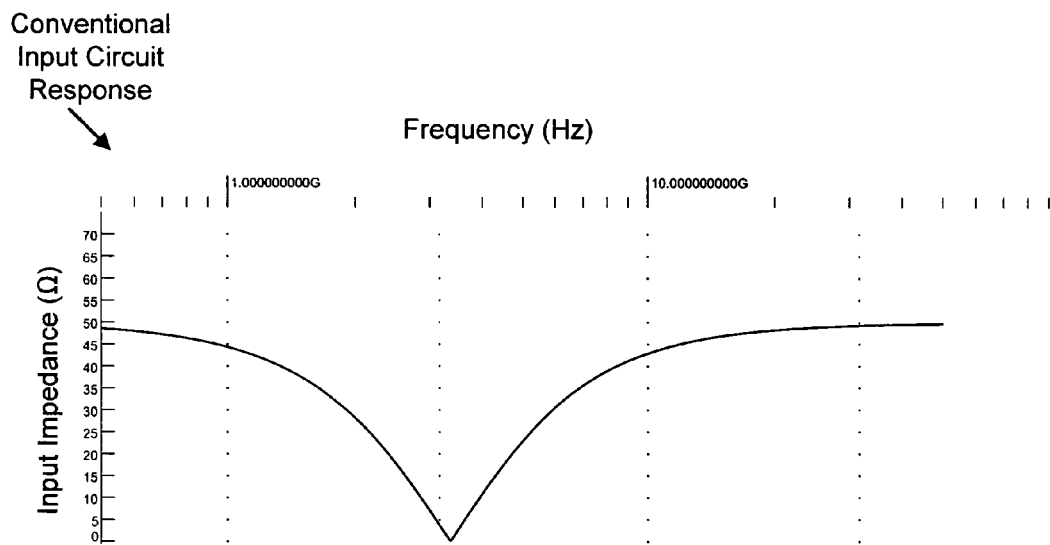
FIG. 2 illustrates a simulation result of an input impedance characteristic of the conventional signaling circuit of FIG. 1.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "coupled" as used herein may include both directly coupled and indirectly coupled through one or more intervening components.

A high-speed input circuit and termination method are described. In one embodiment, an apparatus is described which includes an input buffer configuration including a current-receiving input buffer and associated termination circuitry that presents an almost purely resistive input impedance to an incoming signal, regardless of the actual capacitance present at the input pad. This allows "near-perfect" (in the context) impedance matching to be achieved. Converting the signal voltage to a signal current also facilitates receiving all of the input signal amplitude (as current into the current-receiving input buffer) at very high frequencies, despite a relatively large effective capacitance present on the bond pad. This allows very high frequency signals to be received on the bond pad with improved signal integrity compared to conventional input buffers, while still retaining typical ESD clamps, despite potentially large parasitic capacitances associated with the ESD clamps.

In one embodiment, an apparatus includes an input node, a bond pad, and a signal conversion resistor. The input node may be coupled to a signal conductor such as a transmission line. The bond pad is associated with a die within a component package. The signal conversion resistor is coupled in series between the input node and the bond pad to convert substantially all of a signal voltage at the input node to a signal current at the bond pad. One embodiment of the apparatus is a differential signaling circuit.

In one embodiment, a method includes receiving a signal voltage at a signal conversion resistor coupled to a signal conductor, converting substantially all of the signal voltage to a signal current, and inputting substantially all of the signal current into a trans-impedance amplifier. Other embodiments of the method may include limiting a signal voltage swing across an effective input capacitance of a bond pad coupled to the trans-impedance amplifier, matching a characteristic impedance of the signal conductor, or converting substantially all of the signal current into an output signal voltage usable by circuitry coupled to an output of the trans-impedance amplifier.

Another embodiment of the apparatus includes means for propagating an incoming signal voltage and means for limiting a signal voltage swing across an effective input capacitance of a bond pad coupled to a trans-impedance amplifier. Another embodiment of the apparatus also may include means for converting substantially all of the incoming signal voltage to a signal current, means for isolating a transmission line from a bond pad coupled to the trans-impedance amplifier, or means for matching a characteristic impedance of the transmission line.

Figure 3:
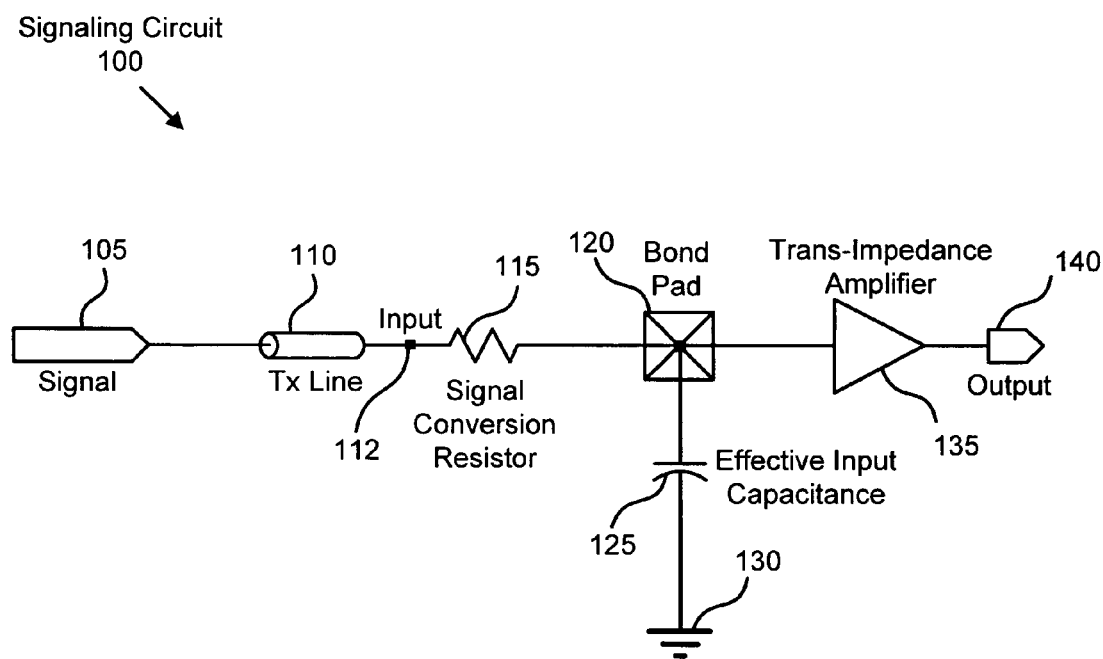
FIG. 3 illustrates one embodiment of a signaling circuit having a signal conversion resistor.

FIG. 3 illustrates one embodiment of a signaling circuit 100. The depicted signaling circuit 100 includes a signal source 105 coupled to a transmission line 110. One example of the transmission line 110 is a trace on a printed circuit board (not shown). Other examples of the transmission line 110 include coaxial cables and other types of cables. The transmission line 110 is coupled to an input node 112 and a signal conversion resistor 115, which is coupled to a bond pad 120. An effective input capacitance 125 is shown between the bond pad 120 and a DC (or static) reference voltage 130 such as ground (but always ground in an AC sense). The bond pad 120 is coupled to an input of a trans-impedance amplifier (TIA) 135. The output 140 of the signaling circuit 100 may be coupled to additional (or "downstream") circuitry (not shown). In one embodiment, the circuitry between the input node 112 and the output 140 is referred to as an input circuit.

In the illustrated embodiment, the signal conversion resistor 115 is coupled in series with the transmission line 110 and the current-receiving input buffer 135. Specifically, the signal conversion resistor 115 "converts" an input signal voltage at the input of the signal conversion resistor 115 to an output signal current through the signal conversion resistor 115, retrieved at the output by the trans-impedance amplifier 135. In this configuration, the full signal current is injected, or input, into the trans-impedance amplifier 135 and converted into a voltage signal usable by voltage-oriented circuitry on the chip (not shown). Converting the signal voltage to a signal current at the signal conversion resistor 115 also effectively isolates the effective input capacitance 125 from the transmission line 110. Additionally, the effective input capacitance 125 does not appear in parallel with the signal conversion resistor 115, in contrast to the conventional signaling circuit of FIG. 1. Therefore, the input impedance seen by the incoming signal in the signaling circuit 100 of FIG. 3 depends mostly only on the value of the signal conversion resistor 115 and the "quality" of the virtual ground created by the trans-impedance amplifier 135 (i.e., the input impedance of the trans-impedance amplifier 135, ideally zero). In this embodiment, the signal conversion resistor 115 also may be referred to as a termination resistor because it may be used to terminate the transmission line 110.

In other embodiments, the signaling circuit 100 may include other components. For example, one embodiment of the signaling circuit 100 may include additional resistors and/or transistors to provide electrostatic discharge (ESD) protection. In one embodiment, one or more current-limiting ESD resistors may be incorporated into the signal conversion resistor 115, or the signal conversion resistor 115 may serve as a current-limiting ESD resistor. It should be noted that, in one embodiment, this may entail moving the ESD resistor off the die, but not necessarily out of the package as discussed in further detail below. Since an ESD resistor is usually substantially larger than the 50Ω typically used for transmission line terminations, the signaling circuit 100 may be modified or arranged in other configurations to accommodate ESD protection.

Figure 4:
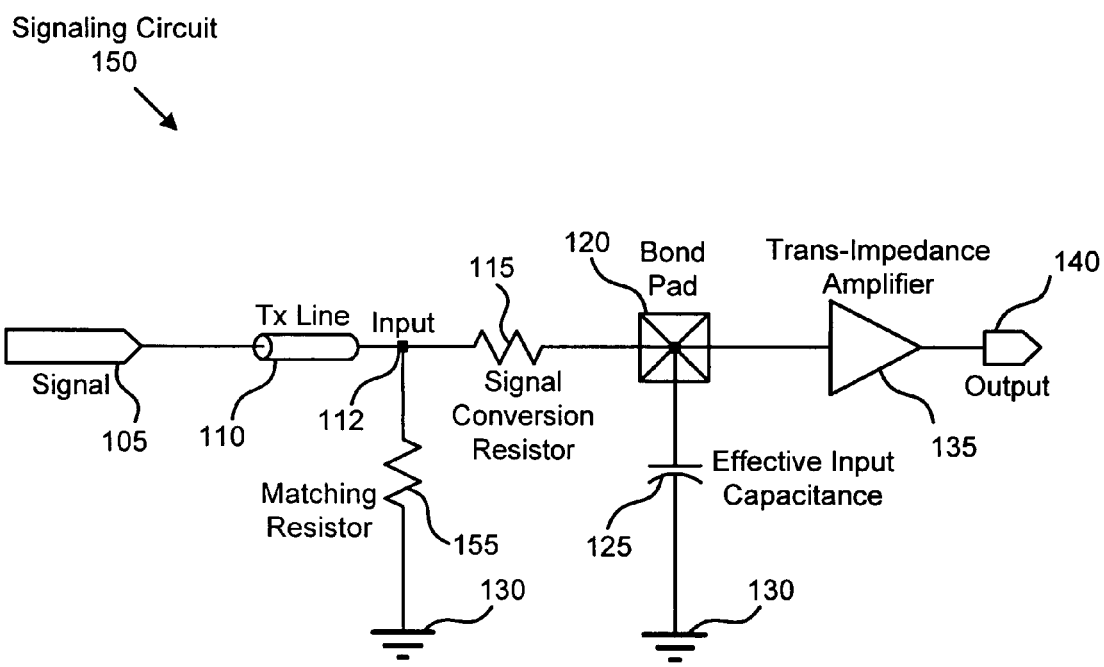
FIG. 4 illustrates an alternative embodiment of a signaling circuit having a signal conversion resistor.

FIG. 4 illustrates an alternative embodiment of a signaling circuit 150 having a matching resistor 155 in addition to a signal conversion resistor 115. The matching resistor 155 is coupled between the input node 112 and a reference voltage 130 such as ground. In this embodiment, the matching resistor 155 may be referred to as a termination resistance because it may be used to provide a matching termination (i.e., to alter the impedance seen from the transmission line 110) for the transmission line 110. In one embodiment, the resistance value of the matching resistor 155 depends on the resistance value of the signal conversion resistor 115 and the characteristic impedance of the transmission line 110. The resistance value of the matching resistor 155 may be different from the characteristic impedance of the transmission line 110. Smith charts or other impedance matching techniques may be used to determine resistance values in actual implementations.

A potential side-effect (but not necessarily undesirable) of including the matching resistor 155 is that some of the signal current will flow through the matching resistor 155 and not into the trans-impedance amplifier 135. However, some of the signal current flow in the matching resistor 155 may facilitate limiting the current in the parasitic package inductances (not shown). Limiting the current in the parasitic package inductances in this manner may improve matching and signal integrity. Also, manufacturing a trans-impedance amplifier 135 that does not consume significant supply current, but which accommodates a slightly smaller injected signal current, may be more efficient. This may be true even for very small signal currents. The values of the signal conversion resistor 115 and matching resistor 155 may be optimized such as to achieve a particular balance, or trade-off, between matching, signal current injected into the trans-impedance amplifier 135, and ESD protection.

One difference between the signaling circuit 150 of FIG. 4 (or the signaling circuit 100 of FIG. 3) and the conventional signaling circuit of FIG. 1 is the use of a trans-impedance amplifier 135 as an input buffer, rather than a conventional voltage-receiving input buffer. Another difference is related to the possible implementation of ESD protection. As mentioned above, the signal conversion resistor 115 coupled in series with the transmission line 110 may facilitate protection against ESD events on the transmission line side of the signal conversion resistor 115 (since the virtual ground is maintained on the buffer side of the series resistor which is the node that is connected to the ESD voltage limiters ("clamps") and contains most of the parasitic input capacitance, which consequently may be quite large, allowing for bigger and stronger clamps without affecting normal circuit operation). For this reason, the signal conversion resistor 115 also may be referred to as a current-limiting resistor. In contrast, the conventional signaling circuit includes the ESD protection resistor (or current-limiting resistor) on the buffer side of the bond pad.

Although the configuration of the signaling circuit 150 may have some implications for packaging and manufacturing, such implications may be addressed to allow certain ESD clamps to be used. One example of a clamp is a device which limits the voltage across it by conducting current when the voltage exceeds a certain threshold and/or ramp rate.

Figure 5:
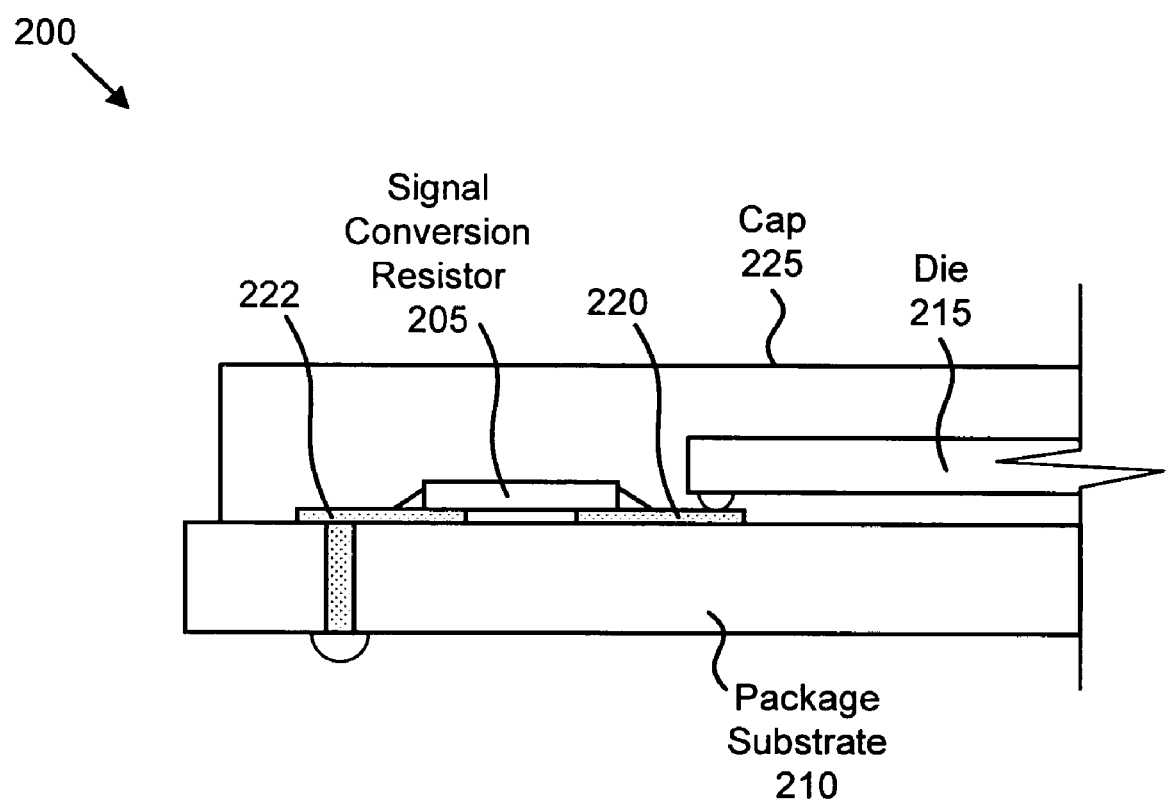
FIG. 5 illustrates one embodiment of a flip-chip packaged die with a signal conversion resistor disposed on the package substrate adjacent to the die.

In one embodiment, parasitic inductances are kept as small as possible. FIG. 5 illustrates one embodiment of a flip-chip circuit 200 with a signal conversion resistor 205 disposed on a package substrate 210 adjacent to a die 215. One end of the signal conversion resistor 205 is coupled via an internal package trace 220 to the solder ball of the die 215. The other end of the signal conversion resistor 205 is coupled via another internal package trace 222 such as a ball grid array (BGA) trace and a via to a solder ball of the package substrate 210.

In this arrangement, the signal conversion resistor 205 may serve as an ESD resistor, as described above. This arrangement limits or eliminates parasitic bondwire inductance, although other inductances may be present. By locating the signal conversion resistor 205 on the package substrate 210, the signal conversion resistor 205 may function within the package to provide ESD protection. Compared to conventional signaling circuits, the ESD protection may be better with the signal conversion resistor 205 on the package substrate 210 because the on-die voltage, in the case of an ESD event, will not be substantially higher than the ESD clamping voltage. This also allows the packaged component to be used in various electronic systems without requiring any customization. In a similar manner, a matching resistor 155 (not shown in FIG. 5) also may be located on the package substrate 210. However, in other embodiments, the signal conversion resistor 205 or the matching resistor 155 may be located in a location other than on the package substrate 210.

Figure 6A:
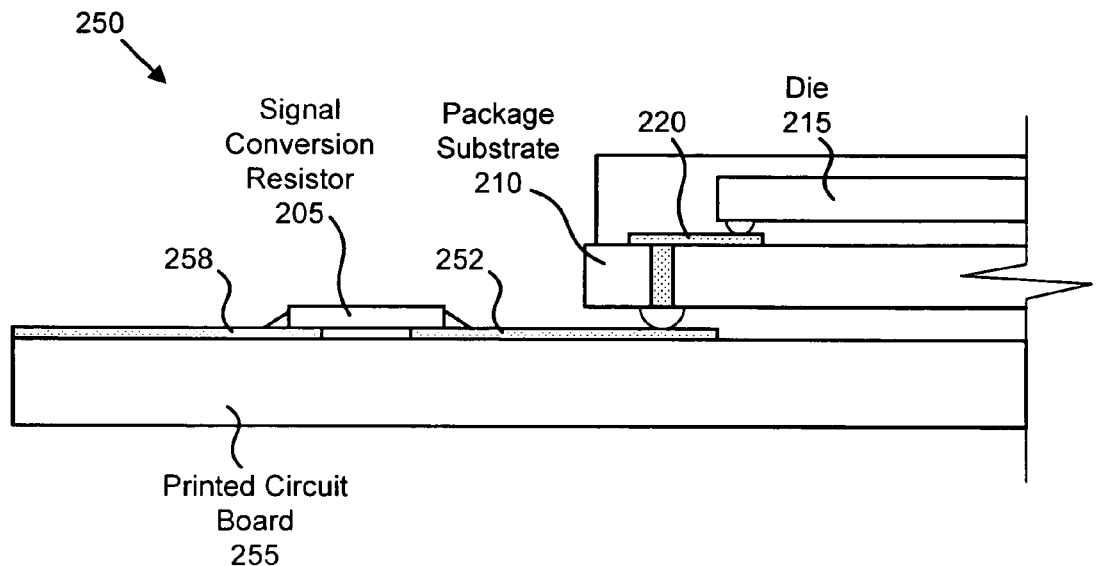
FIG. 6A illustrates an embodiment of a flip-chip circuit with a signal conversion resistor disposed off of the package substrate.

FIG. 6A illustrates another embodiment of a flip chip circuit 250 with a signal conversion resistor 205 disposed off of the package substrate 210. One end of the signal conversion resistor 205 is coupled to a solder pad 252 of the printed circuit board (PCB) 255 on which the package substrate 210 is mounted. The other end of the signal conversion resistor 205 is coupled to a signal conductor 258 such as a transmission line.

Figure 6B:
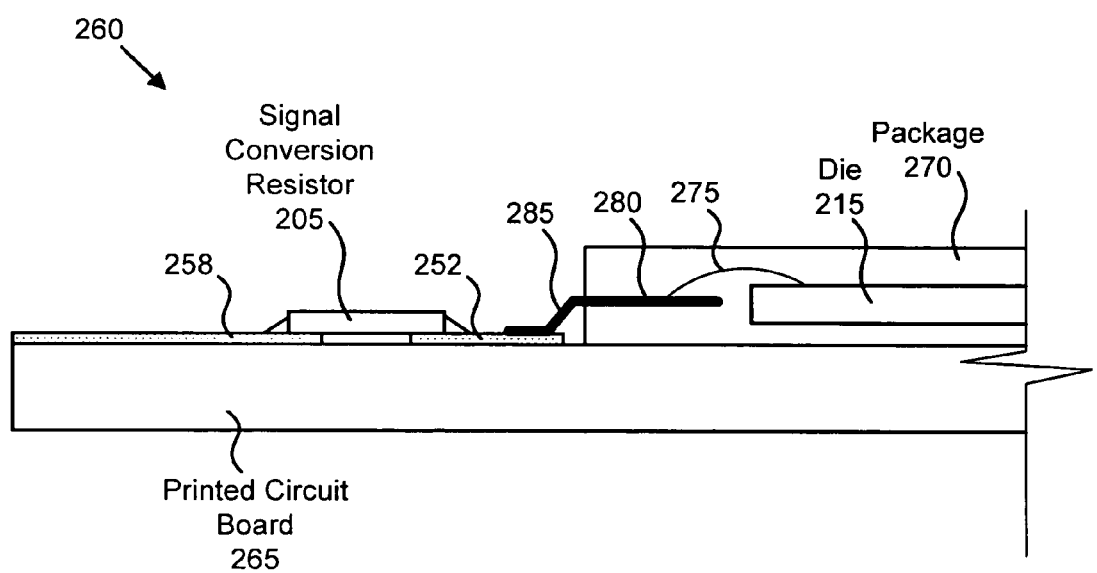
FIG. 6B illustrates another embodiment of a circuit with a signal conversion resistor disposed outside of the package.

FIG. 6B illustrates another embodiment of a circuit 260 with a signal conversion resistor 205 disposed outside of the package 270. In particular, the signal conversion resistor 205 is disposed on the printed circuit board 265 and coupled at one end to a solder pad 252. The other end of the signal conversion resistor 205 is coupled to a signal conductor 258 such as a transmission line. The package 270 is also mounted on the printed circuit board 265, and the die 215 is coupled to the solder pad 252 via a bonding wire 275, the leadframe 280, and the package pin 285. In one embodiment, the bonding wire 275 is coupled to a bond pad at the die 215 and to a landing pad at the leadframe 280.

Figure 7:
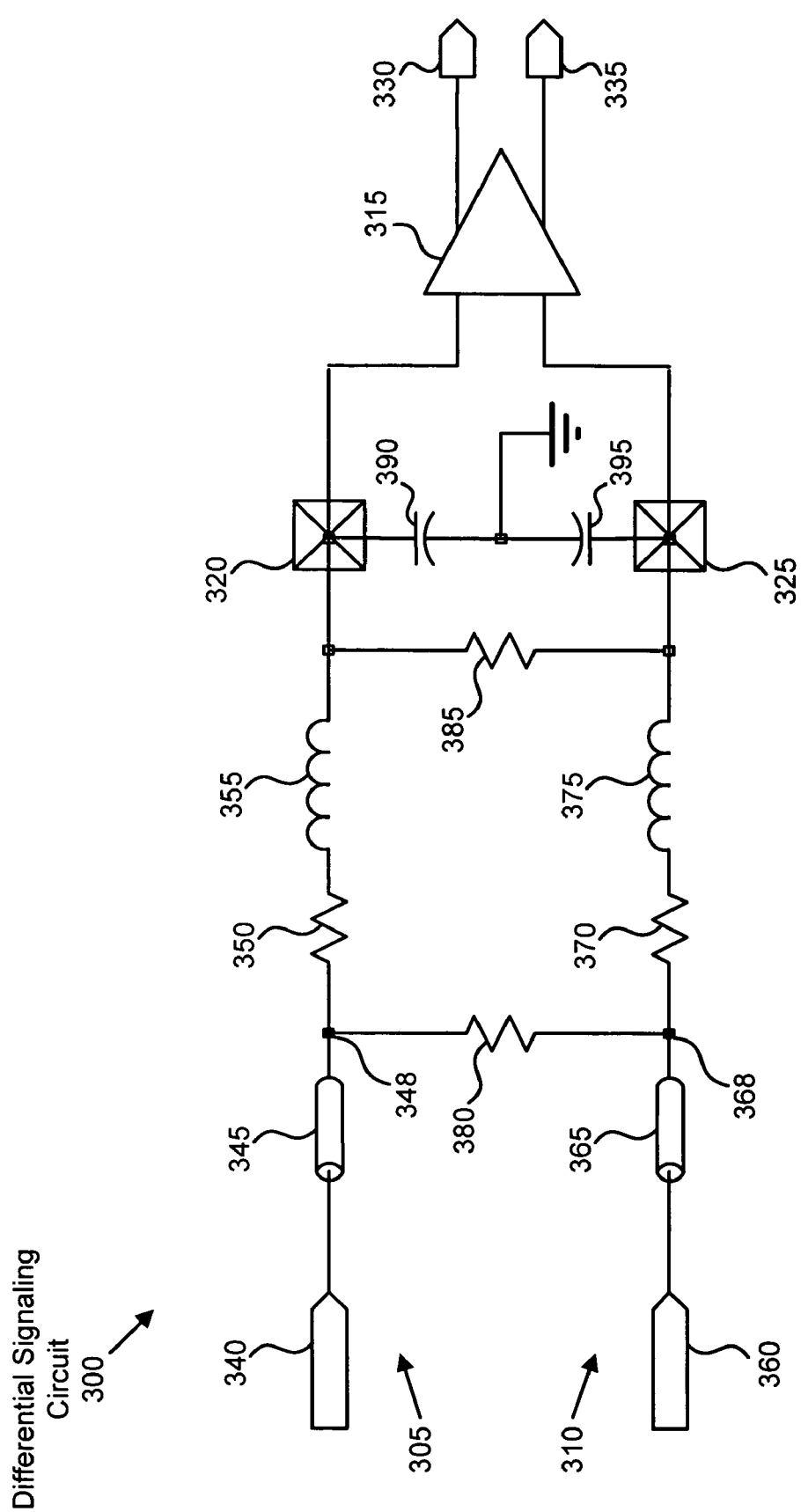
FIG. 7 illustrates one embodiment of a differential signaling circuit.

Another way to improve signal integrity and also reduce parasitic inductance is to use differential signaling. FIG. 7 illustrates one embodiment of a differential signaling circuit 300. In this embodiment, some of the components shown are parasitic, such as bondwire inductance, for example, and others are intentional components, but related to the specific implementation. The illustrated differential signaling circuit 300 includes a first leg 305 and a second leg 310. The first leg 305 and the second leg 310 are each coupled to a trans-impedance amplifier 315. In particular, the first leg 305 is coupled to a first bond pad 320, and the second leg 310 is coupled to a second bond pad 325. The trans-impedance amplifier 315 outputs differential signal voltages at a first output 330 and a second output 335.

In one embodiment, the first leg 305 includes a signal source 340 coupled to the transmission line 345, which is coupled to an input node 348. A signal conversion resistor 350 is coupled in series between the input node 348 and the bond pad 320. An effective input inductance 355 is also shown in series with the signal conversion resistor 350. The second leg 310 includes a signal source 360 coupled to transmission line 365, which is coupled to an input node 368. A signal conversion resistor 370 is coupled in series between the input node 368 and the bond pad 325. An effective input inductance 375 is also shown in series with the signal conversion resistor 370. In one embodiment, the effective input inductances 355 and 375 include package parasitic inductances. A matching resistor 380 is shown coupled between the first leg 305 and the second leg 310 at the inputs nodes 348 and 368. However, other embodiments of the differential signaling circuit 300 may include other types, quantities, or arrangements of components.

In one embodiment, the differential signaling circuit 300 also includes a damping resistor 385. The resistance value of the damping resistor 385 may be related to the specific implementation of the trans-impedance amplifier 315. However, the damping resistor 385 may be omitted from some implementations of the differential signaling circuit 300. In one embodiment, the damping resistor 385 may be implemented as an on-die resistor. In another embodiment, the damping resistor 385 may be integrated with the trans-impedance amplifier 315.

The following Table 1 provides some exemplary component values for the differential signaling circuit 300.

TABLE 1

Exemplary Component Values for the Differential Signaling Circuit

| COMPONENT | VALUE |
| --- | --- |
| Signal Conversion Resistor (First Leg) | 250 Ω |
| Effective Input Inductance (First Leg) | 3 nH |
| Signal Conversion Resistor (Second Leg) | 250 Ω |
| Effective Input Inductance (Second Leg) | 3 nH |
| Matching Resistor | 150 Ω |
| Damping Resistor | 200 Ω |
| Effective Input Capacitance (First Leg) | 3.0 pF |
| Effective Input Capacitance (Second Leg) | 3.0 pF |

Other embodiments of the differential signaling circuit 300 may include components of different values. In one embodiment, the component values of the differential signaling circuit 300 may be determined using Smith charts, numerical analysis, empirical analysis, or through other circuit analysis techniques.

Figure 8:
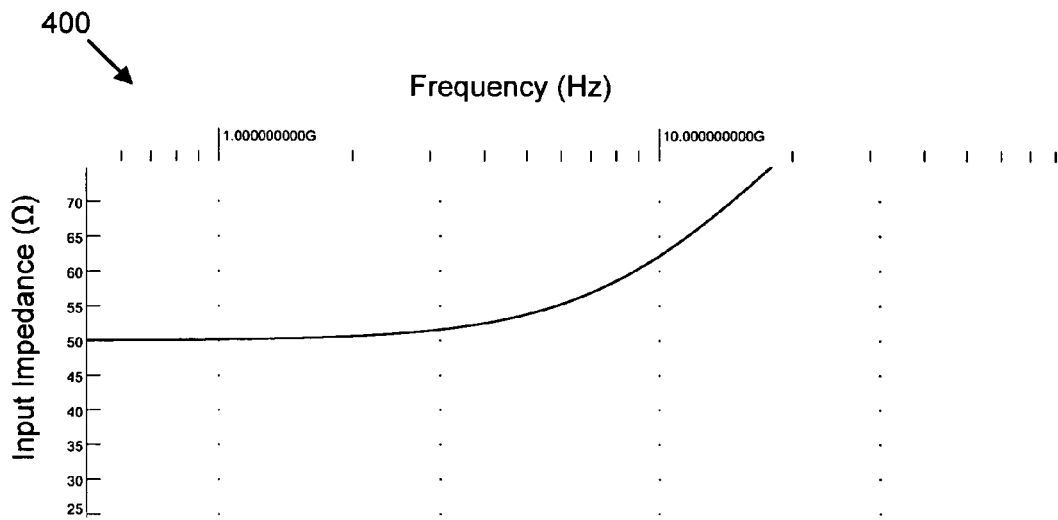
FIG. 8 illustrates a simulation result of an input impedance characteristic of one embodiment of a differential signaling circuit having one or more signal conversion resistors.

FIG. 8 illustrates a simulation result of an input impedance characteristic 400 of one embodiment of a differential signaling circuit 300 having one or more signal conversion resistors 350 and 370. The input impedance characteristic 400 shows that the circuit response does not necessarily degrade as the frequency increases, compared to a conventional signaling circuit. In particular, the (single-ended) input impedance may stay at around 50Ω over a relatively large range of operating frequencies. This is due, at least in part, to the isolation of the effective input capacitances 390 and 395 from the signal voltage swing on the transmission lines 345 and 365. The simulated increase of the input impedance at the higher frequencies is merely a result of the package parasitic (e.g., Bondwire or ball grid array (BGA) trace) inductances. The actual input impedance of the differential signaling circuit 300 does necessarily increase as the operating frequency increases.

Figure 9:
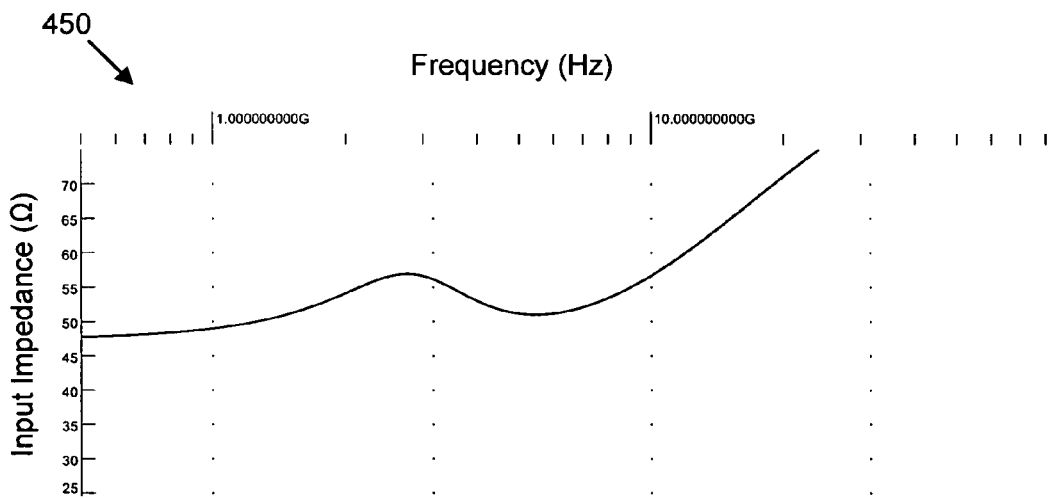
FIG. 9 illustrates a simulation result of an input impedance characteristic of one embodiment of a signaling circuit implemented with one embodiment of a trans-impedance amplifier (TIA) in a 0.15μ technology.

FIG. 9 illustrates a simulation result of an input impedance characteristic 450 of one embodiment of a signaling circuit implemented with one embodiment of a trans-impedance amplifier (TIA) in a 0.15μ technology. The input impedance characteristic 450 of FIG. 9 is different from the input impedance characteristic 400 of FIG. 8 because the input impedance characteristic 400 of FIG. 8 is based on an ideal trans-impedance amplifier. In contrast, the input impedance characteristic 450 of FIG. 9 is based on an actual (i.e., non-ideal) trans-impedance amplifier. The input impedance characteristic 450 of FIG. 9 shows significantly better input impedance over a broad range of operating frequencies compared to a conventional signaling circuit. (The "bump" in the input impedance is due to the inductive input impedance of a particular implementation of the trans-impedance amplifier, and other trans-impedance amplification technologies may have more or less prominent inductive input impedance.)

Figure 10:
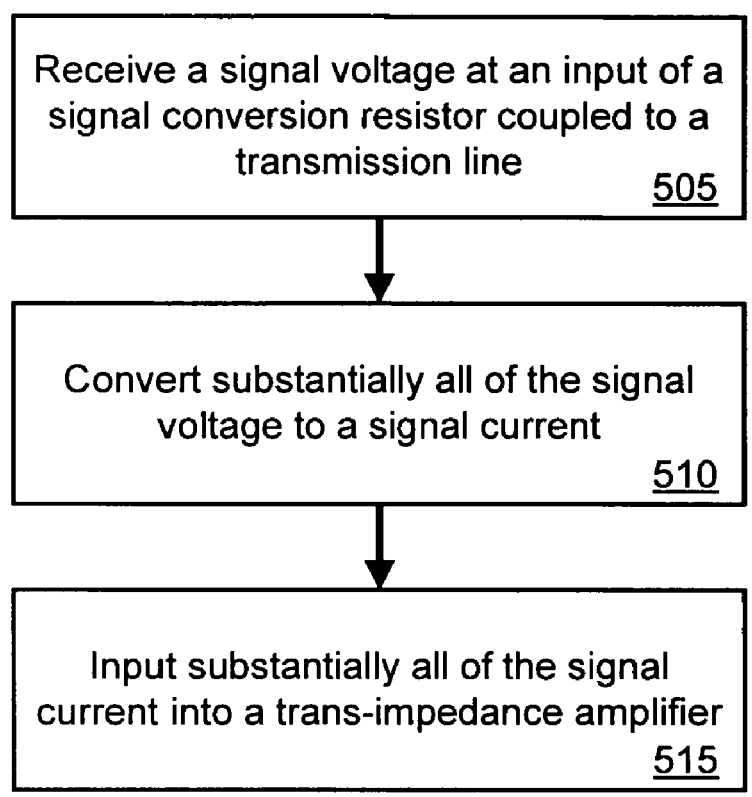
FIG. 10 illustrates one embodiment of a signal conversion method which may be implemented with an input circuit having a signal conversion resistor.

FIG. 10 illustrates one embodiment of a signal conversion method 500 which may be implemented with a signaling circuit 150 having a signal conversion resistor 115. The depicted signal conversion method 500 begins and the signaling circuit 150 receives 505 a signal voltage at a signal conversion resistor 115 coupled to a transmission line 110. The signaling circuit 150 then converts 510 substantially all of the signal voltage to a signal current through the signal conversion resistor 115. Subsequently, the signaling circuit 150 inputs 515 substantially all of the signal current into a trans-impedance amplifier 135. The depicted signal conversion method 500 then ends. In another embodiment, the signal conversion method 500 may include matching the characteristic impedance of the transmission line 110, shunting some of the signal current to a ground reference voltage 130, protecting the signaling circuit 150 during an ESD event, and so forth.

Figure 11:
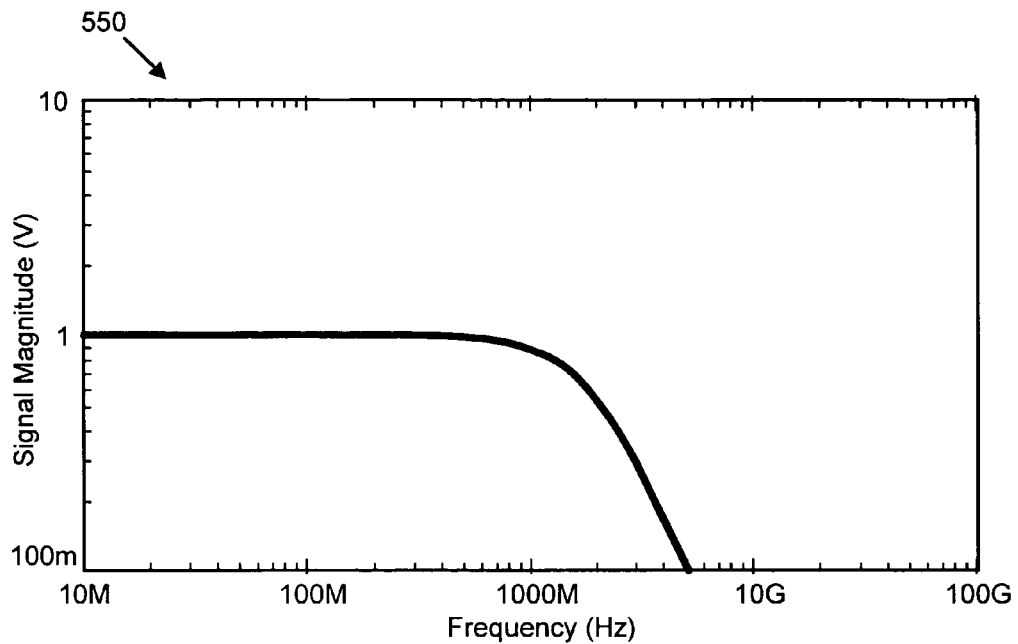
FIG. 11 illustrates a simulation result of a frequency response of a conventional signaling circuit.

FIG. 11 illustrates a simulation result of a frequency response 550 of a conventional signaling circuit. The signal magnitude, initially at 1 V, significantly decreases as the frequency exceeds about 1,000 MHz. (Note that a 50Ω signal source impedance has been used to produce this response.)

Figure 12:
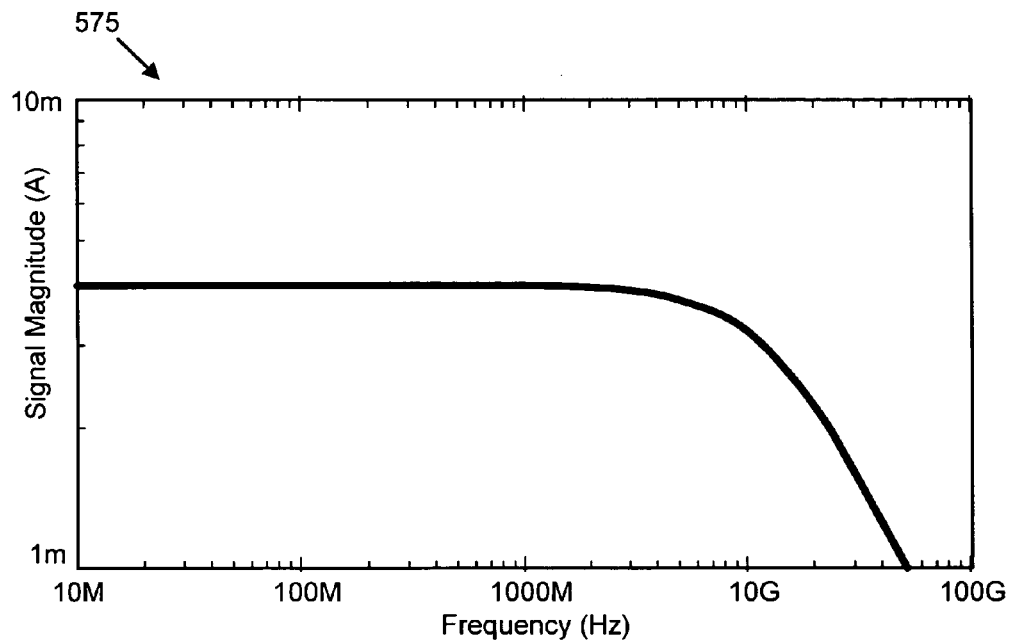
FIG. 12 illustrates a simulation result of a frequency response of a signaling circuit which implements a signal conversion resistor.

FIG. 12 illustrates a simulation result of a frequency response 575 of a signaling circuit which implements a signal conversion resistor 115. The signal magnitude is shown in Ampere, rather than Volt, because of the signal conversion from voltage to current. Although the signal magnitude is shown in Ampere, the signal maintains its initial magnitude of approximately 4 mA beyond the 1,000 MHz frequency range and does not significantly decrease until about 10 GHz. (Note that a 50Ω signal source impedance has been used to produce this response.) Thus, at least one implementation of the input circuit using a signal conversion resistor 115 extends the operating frequency range compared to a conventional input circuit.

The embodiments of the signaling circuits described above may provide one or more advantages compared to conventional signaling circuits. For example, an embodiment of a signaling circuit with a signal conversion resistor may provide improved matching for the transmission line. Another embodiment of the signaling circuit with a signal conversion resistor may provide improved signal integrity over a wider range of operating frequencies. Another embodiment of the signaling circuit with a signal conversion resistor may provide a higher maximum signaling frequency. Although embodiments of the signaling circuit may be deployed in a variety of applications, some exemplary applications may include high-speed serial data communication and high-frequency system clock distribution. Moreover, embodiments of the input circuits described herein may extend the range of signaling frequencies to values unachievable or not easily achievable with conventional technology.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. An apparatus configured to terminate a transmission line, comprising:
   a current receiving differential input buffer; and
   termination circuitry, coupled to the current receiving differential input buffer, wherein the termination circuitry is configured to present a resistive input impedance to an incoming signal present on the transmission line, comprising:
      a first input node and a second input node of a component package, wherein the first input node and the second input node are configured to be coupled to the transmission line to receive the incoming signal;
      a first bond pad and a second bond pad disposed on a die within the component package and coupled to the differential input buffer;
      a first signal conversion resistor coupled in series between the first input node and the first bond pad;
      a second signal conversion resistor coupled in series between the second input node and the second bond pad; and a damping resistor coupled between the first bond pad and the second bond pad.

2. The apparatus of claim 1, wherein the first signal conversion resistor is disposed within the component package and off of the die.

3. The apparatus of claim 1, wherein the first signal conversion resistor is disposed outside of the component package.

4. The apparatus of claim 3, further comprising:
a printed circuit board, wherein the component package and the first signal conversion resistor are disposed on the printed circuit board; and
a transmission trace disposed on the printed circuit board, wherein the first signal conversion resistor is coupled between the transmission trace and the component package.

5. The apparatus of claim 1, wherein the current receiving differential input buffer comprises a trans-impedance amplifier.

6. A method for terminating a transmission line having a differential voltage impressed thereon, comprising:
providing a current receiving differential input buffer and termination circuitry, coupled to the current receiving differential input buffer, wherein the termination circuitry is configured to present a resistive input impedance to an incoming signal present on the transmission line, wherein the termination circuitry comprises a first input node and a second input node of a component package, wherein the first input node and the second input node are configured to be coupled to the transmission line, and wherein a first bond pad and a second bond pad are disposed on a die within the component package and coupled to the differential input buffer;
receiving the differential voltage between the first input node and the second input node;
converting the differential voltage to a first signal current and a second signal current via a first signal conversion resistor coupled between the first input node and the first bond pad and a second signal conversion resistor coupled between the second input node and the second bond pad, respectively;
receiving the first signal current and the second signal current from the first signal conversion resistor and a second signal conversion resistor at a first input and a second input of the differential input buffer respectively; and
damping a resonance signal received between the first input and the second input of the differential input buffer the via a damping resistor coupled therebetween.

7. The method of claim 6, further comprising limiting a signal voltage swing across an effective input capacitance coupled to the differential input buffer.

8. The method of claim 6, further comprising providing electrostatic discharge protection for the differential input buffer.

9. The method of claim 6, further comprising converting substantially all of the first and second signal current into an output signal voltage usable by circuitry coupled to an output of the differential input buffer.

10. The method of claim 6, further comprising matching a characteristic impedance of the transmission line via a matching resistor coupled between the first input node and the second input node.

11. The apparatus of claim 1, further comprising an electrostatic discharge protection circuit coupled to the differential input buffer.

12. The apparatus of claim 1, wherein the resistance value of the damping resistor is related to the implementation of the differential input buffer.

13. The apparatus of claim 1, wherein the damping resistor is implemented as an on-die resistor.

14. The apparatus of claim 1, wherein the damping resistor is integrated with the differential input buffer.

15. The apparatus of claim 1, further comprising a matching resistor coupled between the first input node and the second input node.

16. The apparatus of claim 15, wherein the matching resistor is configured to match a characteristic impedance of the transmission line.

17. The apparatus of claim 1, wherein the damping resistor is configured to dampen a resonance signal received between the first input and the second input of the differential input buffer.

18. An apparatus configured to terminate a transmission line, comprising:
a current receiving differential trans-impedance amplifier; and
termination circuitry, coupled to the current receiving differential trans-impedance amplifier, wherein the termination circuitry is configured to present a resistive input impedance to an incoming signal present on the transmission line, regardless of the actual capacitance present on a bond pad that is coupled to the current receiving differential trans-impedance amplifier, comprising:
a first input node and a second input node of a component package, wherein the first input node and the second input node are configured to be coupled to the transmission line to receive the incoming signal;
a first bond pad and a second bond pad disposed on a die within the component package and coupled to the differential trans-impedance amplifier; and
a first signal conversion resistor coupled in series between the first input node and the first bond pad configured to convert substantially all of a first signal voltage of the incoming signal at the first input node to a first signal current at the first bond pad, wherein the first signal conversion resistor is configured to isolate an effective first input capacitance from a first leg of the transmission line such that the effective first input capacitance does not appear in parallel with the first signal conversion resistor;
a second signal conversion resistor coupled in series between the second input node and the second bond pad configured to convert substantially all of a second signal voltage of the incoming signal at the second input node to a second signal current at the first bond pad, wherein the second signal conversion resistor is configured to isolate an effective second input capacitance from a second leg of the transmission line such that the effective second input capacitance does not appear in parallel with the second signal conversion resistor;
a damping resistor coupled between the first bond pad and the second bond pad configured to dampen a resonance signal received between the first input and the second input of the differential input buffer; and
a matching resistor coupled between the first input node and the second input node configured to match a characteristic impedance of the transmission line.

19. The apparatus of claim 18, further comprising an electrostatic discharge protection circuit coupled to the trans-impedance amplifier.

20. The apparatus of claim 18, wherein the resistance value of the damping resistor is related to the implementation of the trans-impedance amplifier.

* * * * *